(12) United States Patent
Kang

(10) Patent No.: US 6,233,681 B1
(45) Date of Patent: May 15, 2001

(54) COMPUTER SYSTEM AND A CONTROL METHOD OF THE SAME FOR IN-SYSTEM REPROGRAMMING OF A FIXED FLASH ROM WHEN ACCESS TO THE FIXED FLASH ROM IS NOT POSSIBLE

(75) Inventor: Chan-Goo Kang, Suwon (KR)

(73) Assignee: SamSung Electronics Co. Ltd., Suwon (KR)

( * ) Notice: Subject to any disclaimer, the term of this patent is extended or adjusted under 35 U.S.C. 154(b) by 0 days.

(21) Appl. No.: 09/198,407

(22) Filed: Nov. 24, 1998

(30) Foreign Application Priority Data

Nov. 24, 1997 (KR) .................................................. 97-62326

(51) Int. Cl.$^7$ ....................................................... G06F 9/445
(52) U.S. Cl. ................................................................. 713/2
(58) Field of Search ..................................... 713/1, 2, 100

(56) References Cited

U.S. PATENT DOCUMENTS 5,327,531 * 7/1994 Bealkowski et al. ................ 713/1 X
5,473,775   12/1995 Sakai et al. .
5,568,641   10/1996 Nelson et al. .
5,634,079    5/1997 Buxton .
5,805,882    9/1998 Cooper et al. .
5,815,706    9/1998 Stewart et al. .
5,915,080 *  6/1999 Park ........................................ 714/6
6,079,016 *  6/2000 Park ........................................ 713/2

* cited by examiner

Primary Examiner—Thomas M. Heckler
(74) Attorney, Agent, or Firm—Robert E. Bushnell, Esq.

(57) ABSTRACT

Disclosed is a computer system for in-system reprogramming of a fixed flash ROM when access to the fixed flash ROM is not possible. The computer system includes a main board on which the fixed flash ROM is mounted; a fixed ROM socket for mounting on the fixed flash ROM; and a backup flash ROM for insertion in the flash ROM socket such that the backup flash ROM is connected to the fixed flash ROM. Further, the computer system is booted with an operating system stored in the backup flash ROM.

20 Claims, 6 Drawing Sheets

COMPUTER SYSTEM AND A CONTROL METHOD OF THE SAME FOR IN-SYSTEM REPROGRAMMING OF A FIXED FLASH ROM WHEN ACCESS TO THE FIXED FLASH ROM IS NOT POSSIBLE

CLAIM OF PRIORITY

This application makes reference to, incorporates the same herein, and claims all benefits accruing under 35 U.S.C. § 119 from an application entitled COMPUTER SYSTEM AND THEREOF CONTROL METHOD CAPABLE OF REWRITING A FIXED FLASH ROM earlier filed in the Korean Industrial Property Office on the day of Nov. 24, 1997, and there duly assigned Ser. No. 97-62326, a copy of which is annexed hereto.

BACKGROUND OF THE INVENTION

1. Technical Field

The present invention relates to a computer system a control method of the same for in-system reprogramming of a fixed flash ROM when access to the same is not possible. More particularly, the present invention relates to a computer system and a control method of the same capable of reprogramming a fixed flash ROM without removing the same from the computer system when it is not possible to access the fixed flash ROM.

2. Related Art

Computer systems are information handling systems that are utilized by many individuals and businesses today. A computer system can be defined as a microcomputer that includes a central processing unit (CPU), a volatile memory, a non-volatile memory such as read only memory (ROM), a display monitor, a keyboard, a mouse or other input device such as a trackball, a floppy diskette drive, a compact disc-read only memory (CD-ROM) drive, a modem, a hard disk storage device, and a printer. A computer system's main board, which is a printed circuit board known as a motherboard, is used to electrically connect these components together.

The central processing unit is often described as a microprocessor. The microprocessor is an electronic component having internal logic circuitry handling most, if not all, the data processing in the computer system. The internal logic circuitry of microprocessors is typically divided into three functional parts known as the input/output (I/O) unit, the control unit, and the arithmetic-logic unit (ALU). These three functional parts interact together and determine the power and performance of the microprocessor. The combination of the control unit and the arithmetic-logic unit can be referred to as the central processing unit. Also, the combination of the input/output unit, the control unit, and the arithmetic-logic unit can be referred to as the central processing unit.

One example of non-volatile memory is read only memory (ROM). Information stored in non-volatile memory can remain unchanged even when there is a power failure. The information stored in non-volatile memory will stay there until it is changed. Read only memory (ROM) is used to store important information such as instructions for the central processing unit (CPU). There are different types of read only memory (ROM) including, for example, electrically-erasable-programmable-read-only-memory (EEPROM) chip and flash-read-only-memory (flash-ROM). The flash-ROM can also be referred to as flash memory. There are differences between an EEPROM chip and flash-ROM, as shown below.

Computer systems include a basic input output system (BIOS) which is an especially important program stored in read only memory (ROM). The basic input output system (BIOS) tests a computer every time the computer is powered on. The basic input output system (BIOS) can allocate a computer system's resources automatically, making adjustments needed to accommodate new hardware. Also, the basic input output system (BIOS) governs how system board components interact.

When the computer system is powered on, the basic input output system (BIOS) immediately takes control of the computer system and its components. The first duty of the basic input output system (BIOS) is to perform a series of diagnostic routines called the power on self test (POST) routine, which ensures that every part of the computer system's hardware is functioning properly.

A basic input output system (BIOS) that is stored in flash-read-only-memory (flash-ROM) is vulnerable to computer viruses. Computer viruses include malicious computer programs which can be used to erase information stored in memory. I believe there is a need to provide a method of coping with such malicious programs in order to protect a basic input output system (BIOS) stored in flash-read-only-memory (flash-ROM).

Flash ROM, or flash memory, is non-volatile memory that is electrically erasable and reprogrammable. That is, flash ROM, unlike random access memory (RAM), retains its contents even when the power is turned off, and can be updated in the system with new revisions of code, different user parameters or settings, data collected over time, and more. Thus, flash ROM is electrically erasable and reprogrammable.

Flash memory is also sometimes referred to as flash EEPROM (electrically erasable programmable read only memory) because of its reprogrammability. However, flash ROM differs from EEPROM in that EEPROM requires data to be written or erased one byte at a time whereas flash memory allows data to be written or erased in blocks. Flash ROM is also simpler in structure than EEPROM. Flash memory is generally less expensive than dynamic random access memory (DRAM) on a cost per bit basis. Flash memory wears out with repeated use of roughly 100,000 cycles.

The advantages of flash memory include low cost, non-volatility as mentioned above, large storage density, and reprogramability. Further, compared to hard disk drives, flash ROM is lighter and more resilient to shocks.

The drawbacks of flash memory include a limited number of write/erase cycles, slow speed especially on write and erase, and the presence of bad blocks. With regard to presence of bad blocks, some flash memory devices allow small numbers of bad blocks which, while increasing yield and reducing cost, add complexity.

Another drawback of flash memory is that when access to the same is not possible, as a result a of data stored in the flash ROM being erased or a serious error occurring during a reprogramming operation, the flash ROM must be removed from the computer system and reprogrammed. That is, after removing the flash ROM from the computer, the same is mounted in a ROM writer and, using a utility program, is reprogrammed. This is a complicated and time-consuming procedure.

I have found that the above drawbacks of flash memory can be extremely inconvenient. Efforts have been made to reduce the above drawbacks of flash memory.

Exemplars of recent efforts in the art include U.S. Pat. No. 5,815,706 for COMPUTER SYSTEM WITH PLUG-IN OVERRIDE OF SYSTEM ROM issued to Stewart et al., U.S. Pat. No. 5,805,882 for COMPUTER SYSTEM AND METHOD FOR REPLACING OBSOLETE OR CORRUPT BOOT CODE CONTAINED WITHIN REPROGRAMMABLE MEMORY WITH NEW BOOT CODE SUPPLIED FROM AN EXTERNAL SOURCE THROUGH A DATA PORT issued to Cooper et al., U.S. Pat. No. 5,634,079 for SYSTEM FOR PROVIDING FOR A PARALLEL PORT WITH STANDARD SIGNALS AND A FLASH RECOVERY MODE WITH SECOND PREDETERMINED SIGNALS REDEFINING PARALLEL PORT WITH ALTERNATE FUNCTIONS issued to Buxton, U.S. Pat. No. 5,568,641 for POWERFAIL DURABLE FLASH EEPROM UPGRADE issued to Nelson et al., U.S. Pat. No. 5,473,775 for PERSONAL COMPUTER USING FLASH MEMORY AS BIOS-ROM issued to Sakai et al., and U.S. Pat. No. 5,327,531 for DATA PROCESSING SYSTEM INCLUDING CORRUPT FLASH ROM RECOVERY issued to Bealkowski et al.

While these recent efforts provide advantages, I note that they fail to adequately reduce the above drawbacks of flash memory.

SUMMARY OF THE INVENTION

The present invention has been made in an effort to solve the above problems of flash ROM and other problems.

It is an object of the present invention to provide a computer system and method for controlling the same which enables the easy and efficient in-system reprogramming of a fixed flash ROM when access to the same is not possible.

To achieve the above object, the present invention provides a computer system and a control method of the same for in-system reprogramming of a fixed flash ROM when access to the fixed flash ROM is not possible. The computer system includes a mainboard on which the fixed flash ROM is mounted; a flash ROM socket for mounting on the fixed flash ROM; and a backup flash ROM for insertion in the flash ROM socket such that the backup flash ROM is connected to the fixed flash ROM, wherein the computer system is booted with an operating system stored in the backup flash ROM.

According to a feature of the present invention, the computer system further includes a primary sig jumper for connecting the fixed flash ROM to a chip select line, wherein the fixed flash ROM is manually disenabled by the primary jumper.

According to another feature of the present invention, the computer system further includes a backup jumper for connecting the backup flash ROM to the chip select line, wherein when the backup flash ROM is connected to the chip select line through the backup jumper, the primary jumper is removed, thereby disenabling the fixed flash ROM.

The method for controlling the computer system includes the steps of electrically disconnecting the fixed flash ROM from the mainboard, electrically connecting a backup flash ROM to the mainboard, boating the computer system using an operation system stored in the backup flash ROM, electrically disconnecting the backup flash ROM from the mainboard and electrically connecting the fixed flash ROM thereon, and reprogramming data of the fixed flash ROM using a flash ROM rewrite program.

According to a feature of the present invention, the backup flash ROM is electrically connected to the mainboard by mounting a flash ROM socket on the fixed flash ROM and mounting the backup flash ROM in the flash ROM socket such that the fixed flash ROM and the backup flash ROM are connected.

According to another feature of the present invention, the fixed flash ROM and the backup flash ROM are electrically disconnected by a primary jumper and a backup jumper, respectively.

To achieve these and other objects in accordance with the principles of the present invention, as embodied and broadly described, the present invention provides an apparatus, comprising: a central processing unit controlling an initialization of said apparatus, said central processing unit being mounted in said apparatus; a first memory unit storing first data and being mounted in said apparatus; a second memory unit storing second data and being removably mounted in said apparatus; and a switch disposed between said first memory unit and said central processing unit, said switch having a first position electrically coupling said central processing unit with said first memory unit, said switch having a second position coupling said central processing unit with said second memory unit, said central processing unit utilizing said first data for said initialization when said switch corresponds to said first position during said initialization, and said central processing unit utilizing said second data for said initialization when said switch corresponds to said second position during said initialization.

To achieve these and other objects in accordance with the principles of the present invention, as embodied and broadly described, the present invention provides a method, comprising: electrically disconnecting a first memory unit from a board; electrically connecting a second memory unit to said board; initializing a computer system utilizing operating data stored in said second memory unit; electrically disconnecting said second memory unit from the board and electrically connecting said first memory unit to said board; and reprogramming data of said first memory unit using a rewrite program.

To achieve these and other objects in accordance with the principles of the present invention, as embodied and broadly described, the present invention provides a method, comprising: switching a switch to a second position to electrically disconnect a first memory unit from a board of a computer apparatus and electrically connect a second memory unit to said board, said first memory unit storing first data, said second memory unit storing second data; initializing said computer apparatus utilizing said second data stored in said second memory unit; storing third data corresponding to said second data in a third memory unit of said computer apparatus; switching said switch to a first position to electrically disconnect said second memory unit from said board and electrically connect said first memory unit to said board; and writing said third data to said first memory unit.

The present invention is more specifically described in the following paragraphs by reference to the drawings attached only by way of example. Other advantages and features will become apparent from the following description and from the claims.

BRIEF DESCRIPTION OF THE DRAWINGS

In the accompanying drawings, which are incorporated in and constitute a part of this specification, embodiments of the invention are illustrated, which, together with a general description of the invention given above, and the detailed description given below serve to exemplify the principles of this invention.

DETAILED DESCRIPTION OF THE PREFERRED EMBODIMENT

While the present invention will be described more fully hereinafter with reference to the accompanying drawings, in which a preferred embodiment of the present invention is shown, it is to be understood at the outset of the description which follows that persons of skill in the appropriate arts may modify the invention here described while still achieving the favorable results of this invention. Accordingly, the description which follows is to be understood as being a broad, teaching disclosure directed to persons of skill in the appropriate arts, and not as limiting upon the present invention.

Figure 1:
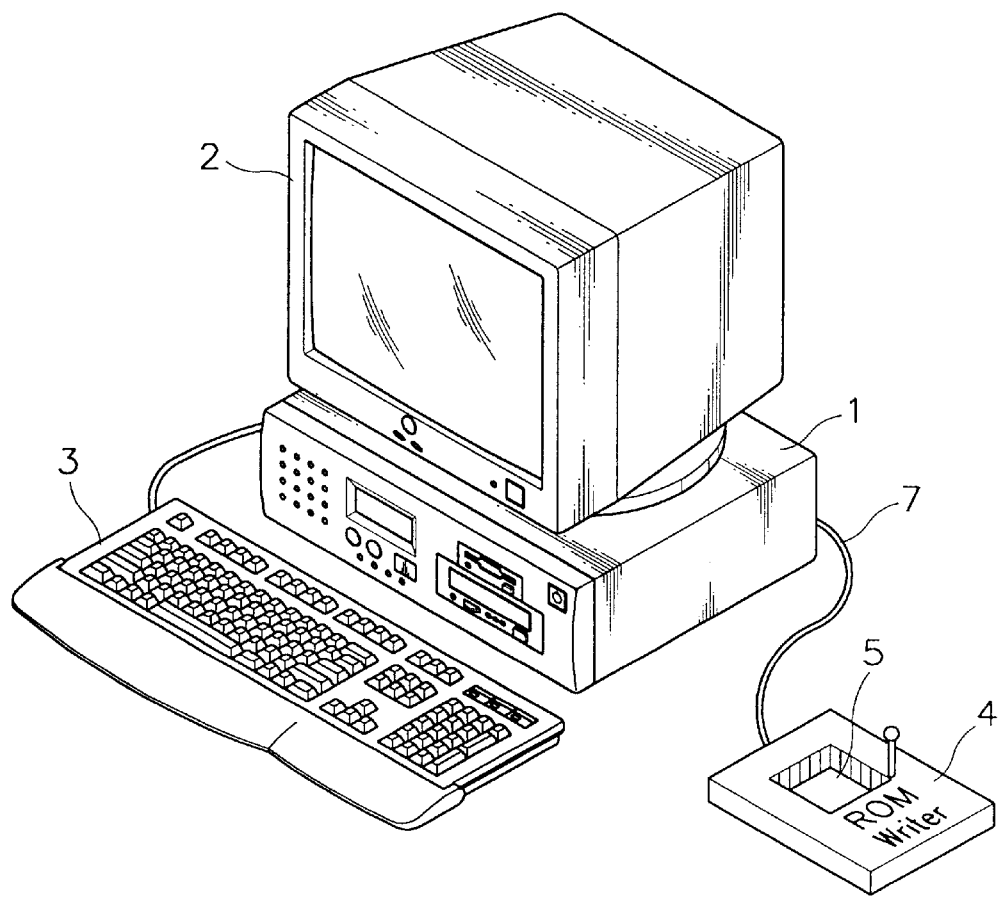
FIG. 1 is a perspective view of a computer system with a flash read only memory writer connected thereto.

Turn now to FIG. 1, which is a perspective view of a computer system with a flash read only memory (flash ROM) writer connected thereto. As shown in FIG. 1, the computer system comprises a main body 1, a monitor 2, a keyboard 3, and a flash ROM writer 4. The flash ROM writer 4 is connected to the main body 1 via a cable 7. The flash ROM writer 4 includes a ROM mounting part into which a flash ROM is inserted. Using a utility program, a user erases, reads, writes, and checks the data of the flash ROM mounted in the flash ROM writer 4.

Figure 2:
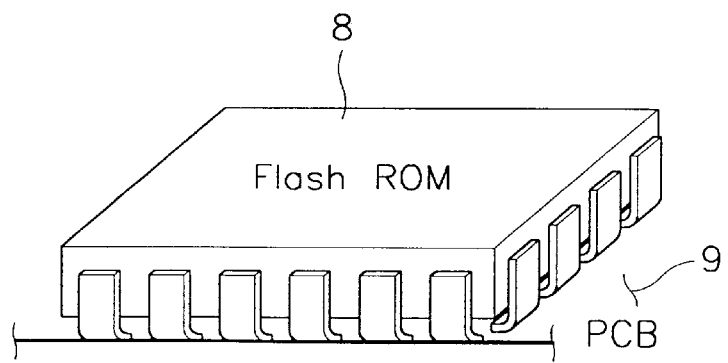
FIG. 2 is a schematic perspective view of a flash read only memory in a state mounted to a printed circuit board in the computer system of FIG. 1.

Turn now to FIG. 2, which is a schematic perspective view of a flash read only memory in a state mounted to a printed circuit board in the computer system of FIG. 1. As shown in FIG. 2, 8. illustrating a schematic perspective view of a flash ROM 8, the flash ROM 8 is mounted on a printed circuit board (PCB) 9 provided in the main body 1 of the computer system of FIG. 1. The flash ROM 8 is manufactured in a surface-mounted device (SMD) form, and is often directly mounted on the printed circuit board 9 to save the cost of providing a socket on the printed circuit board 9 or any other such mounting configuration.

Figure 3:
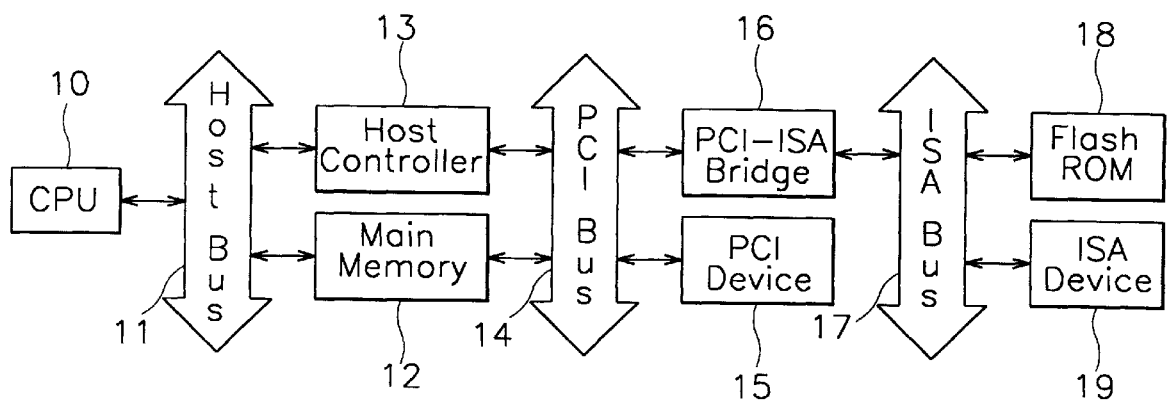
FIG. 3 is a block diagram of a general computer system.

Turn now to FIG. 3, which is a block diagram of a general computer system. As shown in FIG. 3, the general computer system comprises a central processing unit (CPU 10 performing overall control of the computer system, a host bus 11 acting as a passageway for data, commands and control signals, a peripheral component interconnect (PCI) bus 14 and an industry standard architecture (ISA) bus 17, a main memory 12 connected to the host bus 11 and the peripheral component interconnect bus 14, and to which the central processing unit 10 loads system software and user software, a host controller 13 connected between the host bus 11 and the peripheral component interconnect bus 14, a peripheral component interconnect device 15 connected to the peripheral component interconnect bus 14, a peripheral component interconnect bus-industry standard architecture bus (PCI-ISA) bridge 16 providing a connection between the peripheral component interconnect bus 14 and the industry standard architecture bus 17, a flash ROM 18 connected to the industry standard architecture bus 17 and programmed with specific programs that the central processing unit (CPU) 10 runs, and an industry standard architecture device 19 connected to the industry standard architecture bus 17.

Figure 4:
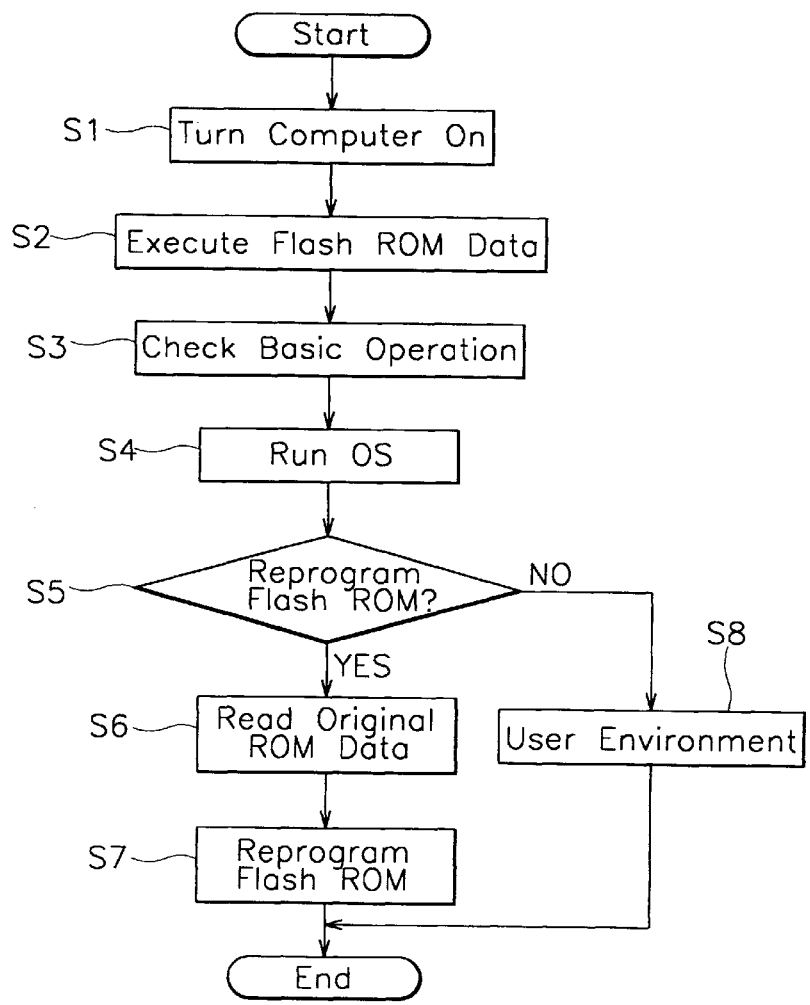
FIG. 4 is a flowchart of a method of reprogramming a flash read only memory in the general computer system FIG. 3.

Turn now to FIG. 4, which is a flowchart of a method of reprogramming a flash read only memory in the general computer system of FIG. 3. In FIG. 4, at step S1, the power of the computer system is turned on. At step S2, the central processing unit 10 reads the ROM data stored in the flash ROM 18. At step S3, the central processing unit 10 executes basic operations. At this time, if the data stored in the flash ROM 18 has been inadvertently erased or if an error occurs in the same, the computer system either is not able to operate or operates incorrectly.

In FIG. 4, at step S4, when there is no problem in the data stored in the flash ROM 18, the operating system (OS) is run. At step S5, the central processing unit 10 determines if a user command has been given for reprogramming the flash ROM 18. At step S6, when it is determined in step S5 that the user has given a command for reprogramming the flash ROM 18, the original ROM data is read using a flash ROM utility program. At step S7, the flash ROM 18 is rewritten using the original ROM data. At step S8, the normal user environment is maintained if no command is detected for the rewriting of the flash ROM 18 is detected in step S5 above.

In FIG. 4, during the rewriting of the flash ROM 18 in step S7 above, if the computer system malfunctions, an error occurs in the data stored in the flash ROM 18. Accordingly, when the computer is turned back on after the computer is turned off, the computer system is not able to operate.

If the data stored in the flash ROM 18 has been erased or an error occurs in the same, the flash ROM 18 must be removed from the printed circuit board (PCB) 9 shown in FIG. 2 and then reprogrammed using the ROM writer 4 shown in FIG. 1, after which the flash ROM 18 is again mounted in the computer system. As a result, the user is greatly inconvenienced as the above process is complicated and time-consuming. Further, since a soldering iron is typically used in the process of removing the flash ROM from the printed circuit board, the high degree of heat emitted from the soldering iron may damage the connections and features of the printed circuit board and may damage the printed circuit board pattern.

A preferred embodiment of the present invention will now be described in detail with reference to the accompanying drawings. Turn now to FIG. 5, which shows a circuit diagram of a fixed flash read only memory and lines connected thereto before a backup flash read only memory is mounted, in accordance with the principles of the present invention.

Figure 5:
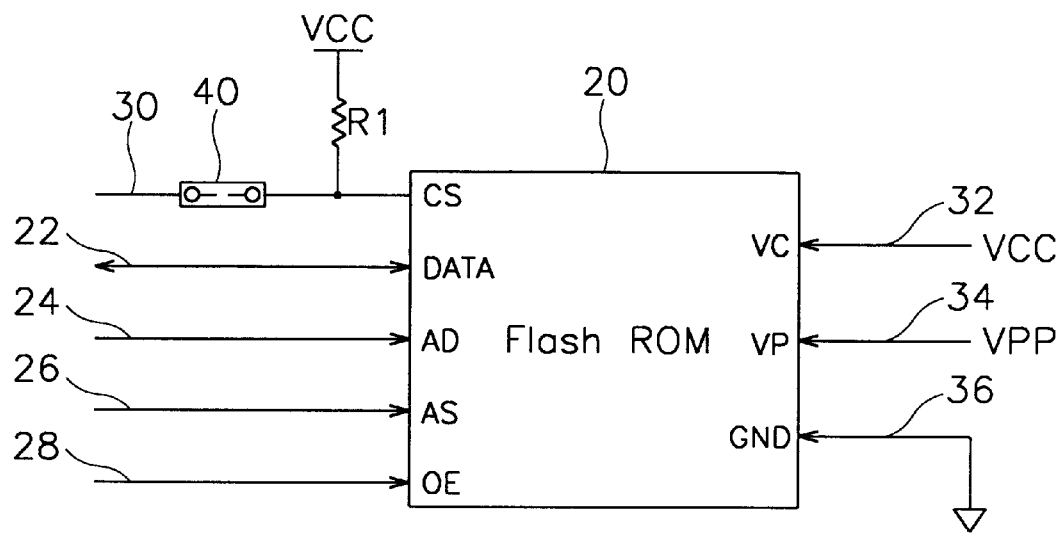
FIG. 5 shows a circuit diagram of a fixed flash read only memory and lines connected thereto before a backup flash read only memory is mounted, in accordance with the principles of the present invention.

As shown in FIG. 5, lines connected to a fixed flash ROM 20 include a data line 22, an address line 24, an address strobe line 26, an output enable line 28, a chip select line 30, and power lines 32, 34, and 36. The chip select line 30 is connected to the fixed flash ROM 20 through a primary jumper 40 such that the fixed flash ROM 20 can be manually disabled.

Figure 6:
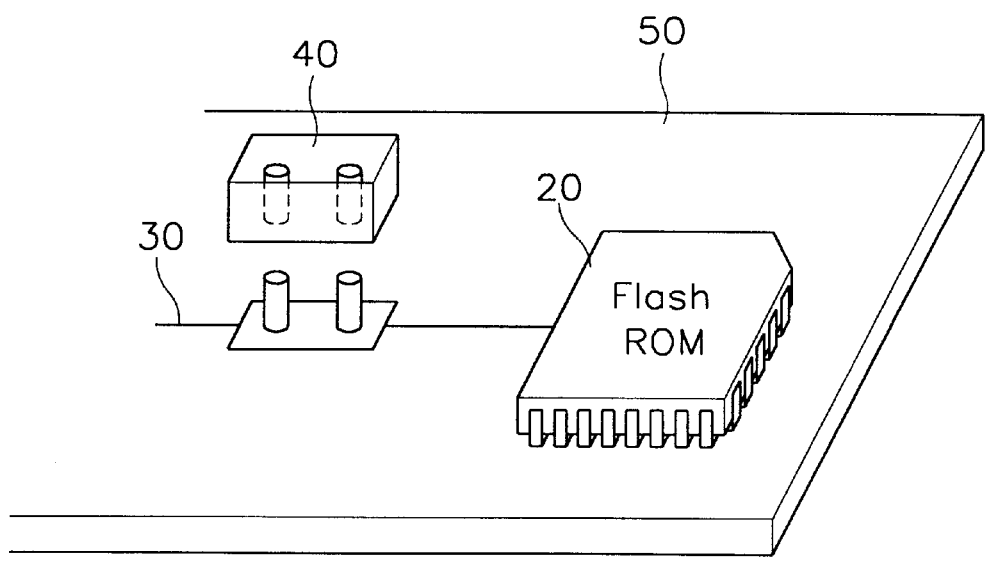
FIG. 6 is a perspective view of the fixed flash read only memory, the chip select line, and the jumper shown in FIG. 5, in accordance with the principles of the present invention.

Turn now to FIG. 6, which is a perspective view of the fixed flash read only memory, the chip select line, and the jumper shown in FIG. 5, in accordance with the principles of the present invention. FIG. 6 shows a perspective view of the fixed flash ROM 20, the chip select line 30, and the primary jumper 40 shown in FIG. 5. As shown in FIG. 6, the fixed flash ROM 20 is provided on a main board 50 of the computer system, and the primary jumper 40 is mounted on the chip select line 30 connected to the fixed flash ROM 20. The main board 50 can be a printed circuit board.

Figure 7:
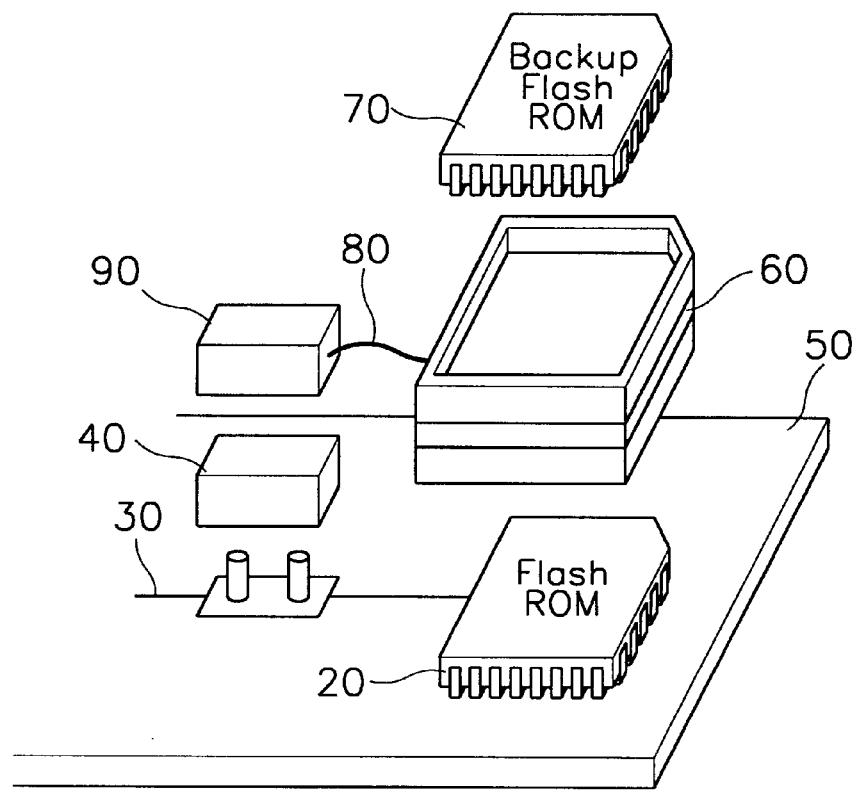
FIG. 7 is an exploded perspective view of a flash read only memory socket, a backup flash read only memory, a backup chip select line, and a backup jumper to be mounted to the elements of FIG. 6, in accordance wit the principles of the present invention.

Turn now to FIG. 7, which is an exploded perspective view of a flash read only memory socket, a backup flash read only memory, a backup chip select line, and a backup jumper to be mounted to the elements of FIG. 6, in accordance with the principles of the present invention. FIG. 7 shows an exploded perspective view of a flash ROM socket 60, a backup flash ROM 70, a backup chip select line 80, and a backup jumper 90 to be mounted to the elements of FIG. 6. As shown in FIG. 7, when assembled, the flash ROM socket 60 is provided over the fixed flash ROM 20 such that the flash ROM socket 60 completely covers the fixed flash ROM 20. Further, the backup flash ROM 70 is inserted in a top portion of the flash ROM socket 60. The backup chip select line 80 extends from the flash ROM socket 60 to connect to the backup jumper 90.

Figure 8:
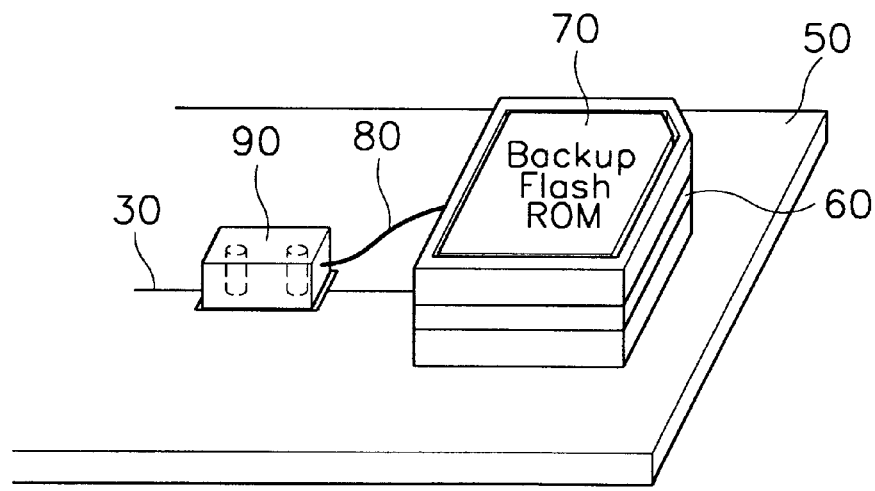
FIG. 8 is a partial perspective view of the elements of FIG. 7 and the elements of FIG. 6 in a fully assembled state, in accordance with the principles of the present invention.

Turn now to FIG. 8, which is a partial perspective view of the elements of FIG. 7 and the elements of FIG. 6 in a fully assembled state, in accordance with the principles of the present invention. FIG. 8 includes the flash ROM socket 60 mounted on the fixed flash ROM 20 and the backup flash ROM 70 inserted in the flash ROM socket 60, the two flash ROMs 20 and 70 are connected. At this time, the primary jumper 40 is removed, and the backup jumper 90 is mounted in its place. Accordingly, the backup chip select line 80, connected at one end to the flash ROM pocket 60 and at its other end to the backup Jumper 90, is connected to the chip select line 30.

Figure 9:
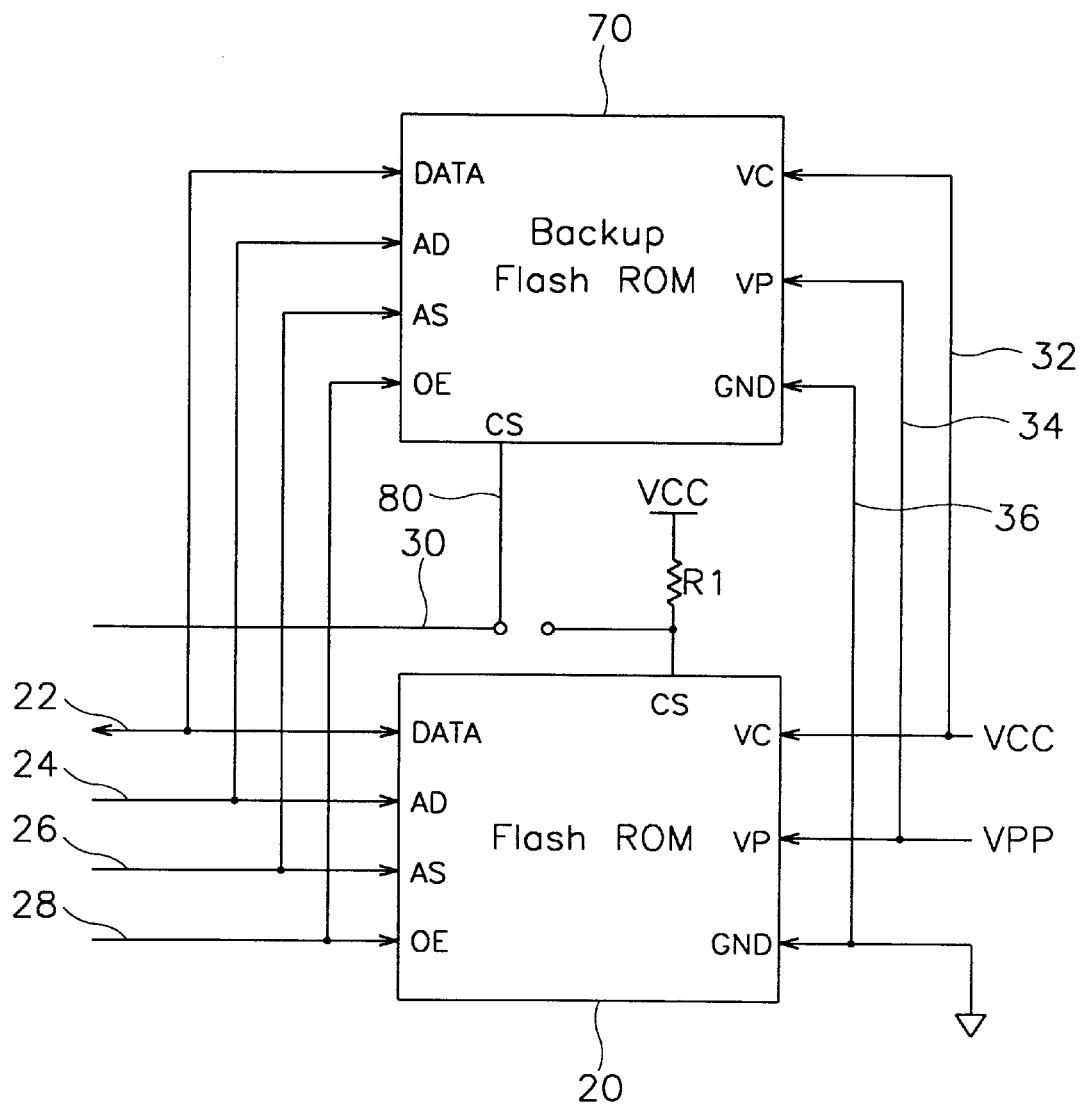
FIG. 9 shows a circuit diagram of the fixed flash read only memory and the backup flash read only memory shown in FIG. 8, and lines connected thereto, in accordance with the principles of the present invention.

Turn now to FIG. 9, which shows a circuit diagram of the fixed flash read only memory and 9. the backup flash read only memory shown in FIG. 8, and lines connected thereto, in accordance with the principles of the present invention. FIG. 9 includes a data line 22, an address line 24, an address strobe line 26, an output enable line 28, and power lines 32, 34 and 36, all connected to the fixed flash ROM 20, being connected to the backup flash ROM 70 through the flash ROM socket 60. Further, the chip select line 30 is connected to the backup chip select line 80 through the backup jumper 90 as shown in FIG. 8.

Figure 10:
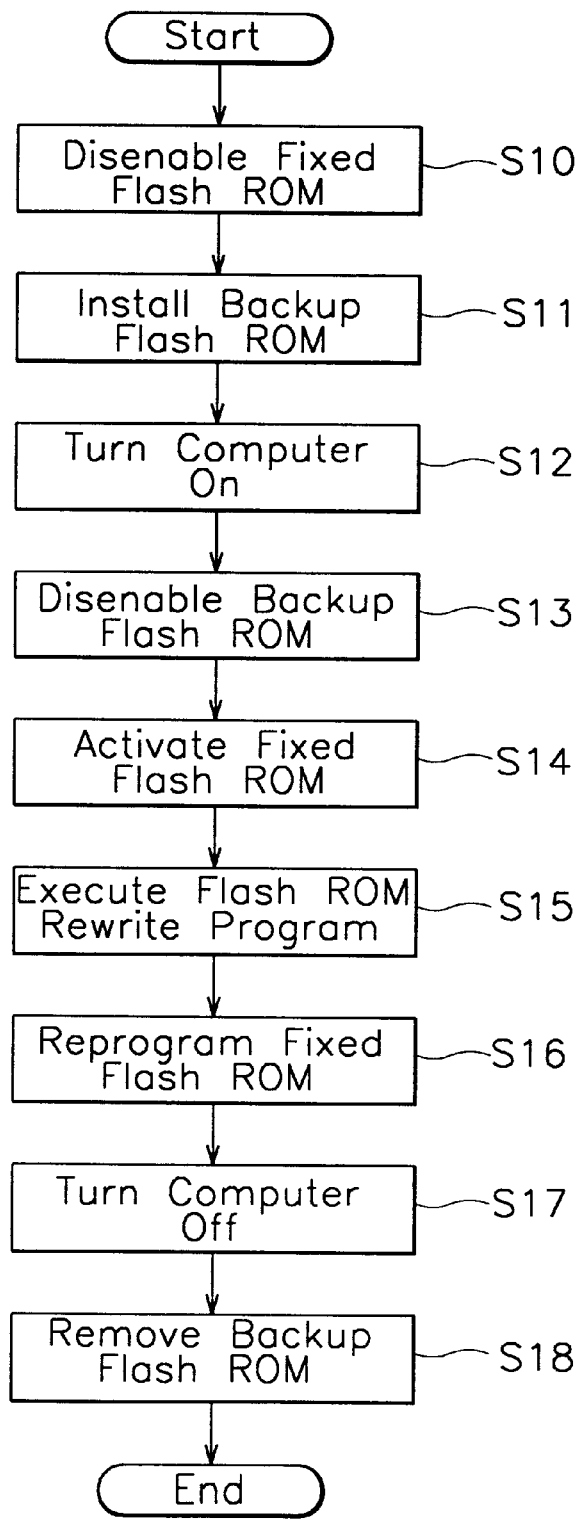
FIG. 10 is a flowchart of a control method for a computer system enabling in-system reprogramming a flash read only memory, in accordance with the principles of the present invention.

Turn now to FIG. 10, which is a flowchart of a control method for a computer system enabling in-system reprogramming a flash read only memory, in accordance with the principles of the present invention. At step S10, the fixed flash ROM 20 mounted on the main board 50 is disabled. At step S11, the flash ROM socket 60 is mounted on the fixed flash ROM 20, and the backup flash ROM 70 is mounted in the flash ROM socket 60 such that the two flash ROMs 20 and 70 are connected. At step S12, the computer is turned on. At step S13, the backup flash ROM 70 is disabled. At step S14, the fixed flash ROM 20 is activated. At step S15, the flash ROM rewrite program is executed. At step S16, the fixed flash ROM 20 is reprogrammed. At step S17, the computer is turned off. At step S18, the flash ROM socket 60 and the backup flash ROM 70 are removed from the fixed flash ROM 20. The above method shown in FIG. 10 of the present invention will be described in more detail hereinafter.

First, before the process of FIG. 10 begins, the computer is turned off to enable the mounting of the backup flash ROM 70 on the fixed flash ROM 20 fixedly mounted to the main board of the computer. At step S10, the fixed flash ROM 20 is disabled not to boot with the operating system stored in the fixed flash ROM. Here, although many methods can be used to perform this operation, in the present invention, the chip select line 30 is disconnected from the flash ROM by removing the primary jumper 40.

At step S11, the flash ROM socket 60 is mounted on the fixed flash ROM 20, and the backup flash ROM 70 in mounted in the flash ROM socket 60 such that the two flash ROMs 20 and 70 are connected, and the backup jumper 90 is mounted to the position where the primary jumper 40 was mounted. Accordingly, the computer is able to be booted using the operating system data stored in the backup flash ROM 70.

With the flash ROM socket 60 and the backup flash ROM 70 mounted in this manner all the lines connected to ROM 20 (the data line 22, the address line 24, the address strobe line 26, the output enable line 28, and the power lines 32, 34, and 36) are connected to the backup flash ROM 70. Also, by the mounting of the jumper 90, the backup chip select line 80 is connected to the chip select line 30 provided on the main board 50. At step S12, the computer is turned on. At this time, the backup flash ROM 70 operates whereas the fixed flash ROM 20 fixed to the main board 50 remains disengaged. If the user environment is set up by the operation of the backup flash ROM 70, the operating system of the backup flash ROM 70 is copied in the random access memory (RAM) to execute the operating system of the random access memory. At step S 13, the backup flash ROM 70 is disabled by disconnecting the backup jumper 90.

At step S14, since the fixed flash ROM 20 must be operated to rewrite the same, the fixed flash ROM 20 is activated by re-connecting the primary jumper 40, thereby connecting the chip select fine 30 to the fixed flash ROM 20. At step S15, the user executes a flash ROM rewrite program. The flash ROM rewrite program is stored in a hard disk or a floppy disk. Also stored on the hard disk or floppy disk is original data and upgrade data for the fixed flash ROM 20 to be rewritten.

At step S16, the user writes the original data or the upgrade data in the fixed flash ROM 20 such that the fixed flash ROM 20 is reprogrammed. At step S17, after running the flash ROM rewrite program, the computer system is turned off. At step S18, the flash ROM socket 60 and the backup flash ROM 70 are removed from the fixed flash ROM 20. As a result, when the computer is turned back on, the same is re-booted using the rewritten data stored in the fixed flash ROM 20.

In the above inventive computer system and method for controlling the same, since the fixed flash ROM need not be removed from the printed circuit board to reprogram the flash ROM, much time can be saved and damage to the printed circuit board occurring during the process of removing the flash ROM can be prevented.

The foregoing paragraphs describe the details of a computer system and a control method of the same for in-system reprogramming of a fixed flash ROM when access to the fixed flash ROM is not possible. More particularly, the foregoing paragraphs describe the details of a computer system and a control method of the same capable of reprogramming a fixed flash ROM without removing the fixed flash ROM from the computer system when it is not possible to access the fixed flash ROM.

While the present invention has been illustrated by the description of embodiments thereof, and while the embodiments have been described in considerable detail, it is not the intention of the applicant to restrict or in any way limit the scope of the appended claims to such detail. Additional advantages and modifications will readily appear to those skilled in the art. Therefore, the invention in its broader aspects is not limited to the specific details, representative apparatus and method, and illustrative examples shown and described. Accordingly, departures may be made from such details without departing from the spirit or scope of the applicant's general inventive concept.

What is claimed is:

1. An apparatus, comprising:
    a central processing unit controlling an initialization of said apparatus, said central processing unit being mounted in said apparatus;
    a first memory unit storing first data and being mounted in said apparatus;
    a second memory unit storing second data and being removably mounted in said apparatus;
    a switch in disposed between said first memory unit and said central processing unit, said switch being disposed between said second memory unit and said central processing unit said switch having a first position electrically coupling said central processing unit with said first memory unit, said switch having a second position coupling said central processing unit with said second memory unit, said central processing unit utilizing said first data for said initialization when said switch corresponds to said first position during said initialization, and said central processing unit utilizing said second data for said initialization when said switch corresponds to said second position during said initialization; and
    a socket unit being removably disposed between said first memory unit and said second memory unit facilitating said mounting of said second memory unit, wherein said apparatus corresponds to a computer system, said first memory unit corresponds to a first flash read only memory said second memory unit corresponds to a second flash read only memory and said initialization of said apparatus corresponds to a booting operation of said computer system.

2. The apparatus of claim 1, said switch further comprising:
    a first jumper being mounted to electrically couple said central processing unit to said first memory unit; and
    a second jumper being mounted to electrically couple said central processing unit to said second memory unit.

3. The apparatus of claim 1, wherein said switch corresponds to said second position when said first data is damaged.

4. The apparatus of claim 1, wherein said switch corresponds to said second position when said first memory unit is damaged.

5. The apparatus of claim 1, wherein said switch corresponds to said second position when said first data is not accessible.

6. The apparatus of claim 1, wherein said first data includes a first basic input output system and said second data includes a second basic input output system.

7. The apparatus of claim 1, when said central processing unit utilizes said second data for said initialization, said switch being switched to said first position after said initialization of said apparatus is performed.

8. The apparatus of claim 2, when said switch is switched to said first position after said initialization of said apparatus is performed, said first data stored in said first memory is reprogrammed.

9. The apparatus of claim 1, further comprising a third memory unit controlled by said central processing unit, wherein said central processing unit performs said initialization utilizing said second data and stores said second data in said third memory unit when said switch corresponds to said second position during said initialization.

10. The apparatus of claim 9, wherein said third memory unit further comprises a random access memory.

11. The apparatus of claim 9, wherein said central processing unit reads said second data from said third memory unit and then writes said second data to said first memory unit when said switch corresponds to said first position after said initialization has been performed with said switch corresponding to said second position.

12. A method, comprising:
    electrically disconnecting a first memory unit storing first data from a board;
    electrically connecting a second memory unit storing operating data to said board;
    initializing a computer system utilizing the operating data stored in said second memory unit;
    electrically disconnecting said second memory unit from said board and electrically connecting said first memory unit to said board; and
    reprogramming the first data stored in said first memory unit using a rewrite program said first memory unit corresponding to a first flash read only memory said second memory unit corresponding to a second flash read only memory said initializing of said computer system corresponding to a booting operation of said computer systems the operating data stored in said second memory unit corresponding to operating system data stored in said second memory unit, said second memory unit being electrically connected to said board by mounting a socket on said first memory unit and mounting said second memory unit in said socket to connect said first and second memory units.

13. The method of claim 12, said connecting of said second memory unit to said board being performed before said initializing of said computer system utilizing the operating data stored in said second memory unit.

14. The method of claim 12, after said reprogramming of the first data stored in said first memory unit using said rewrite program, said method further comprising:
    powering off said computer system;
    removing said socket and said second memory unit; and
    initializing said computer system utilizing the reprogrammed first data stored in said first memory unit.

15. The method of claim 12, wherein said first and second memory units are electrically disconnected by a primary jumper and a backup jumper, respectively.

16. The method of claim 15, wherein said reprogramming further comprises writing new data corresponding to said operating data of said second memory unit into said first memory unit.

17. A method, comprising:

electrically connecting a second memory unit to a first memory unit using a socket;

switching a switch to a second position to electrically disconnect said first memory unit from a board of a computer apparatus and electrically connect said second memory unit to said board, said first memory unit corresponding to a flash read only memory storing first data, said second memory unit storing second data;

initializing said computer apparatus utilizing said second data stored in said second memory unit;

storing third data corresponding to said second data in a third memory unit of said computer apparatus;

switching said switch to a first position to electrically disconnect said second memory unit from said board and electrically connect said first memory unit to said board; and reprogramming said first data stored in said first memory unit utilizing said third data.

18. The method of claim 17, wherein said initializing of said computer apparatus corresponds to a booting of said computer apparatus, said first memory unit being connected to a first connector of said socket, said second memory unit being connected to a second connector of said socket.

19. The method of claim 18, wherein said switching of said switch to said second position is performed when said first data is damaged, said second memory unit corresponds to a second flash read only memory.

20. The method of claim 19, further comprising initializing said computer apparatus utilizing said reprogrammed first data stored in said first memory unit after said reprogramming is performed.

* * * * *